United States Patent
Ha

(10) Patent No.: US 7,670,728 B2
(45) Date of Patent: Mar. 2, 2010

(54) METHOD FOR REPAIRING BRIDGE IN PHOTO MASK

(75) Inventor: Tae Joong Ha, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 293 days.

(21) Appl. No.: 11/770,540

(22) Filed: Jun. 28, 2007

(65) Prior Publication Data
US 2008/0160428 A1 Jul. 3, 2008

(30) Foreign Application Priority Data
Dec. 29, 2006 (KR) .................. 10-2006-0138838

(51) Int. Cl.
*G03F 1/00* (2006.01)
(52) U.S. Cl. ........................................... 430/5
(58) Field of Classification Search .............. 430/5, 430/30, 322, 323, 324
See application file for complete search history.

(56) References Cited

U.S. PATENT DOCUMENTS

| | | | |
|---|---|---|---|
| 5,254,418 A | 10/1993 | Kamon et al. | |
| 6,991,878 B2 | 1/2006 | Kanamitsu et al. | |
| 2004/0224238 A1* | 11/2004 | Chin et al. | 430/5 |
| 2006/0051681 A1* | 3/2006 | Taylor | 430/5 |
| 2006/0093925 A1* | 5/2006 | Cheng | 430/5 |

FOREIGN PATENT DOCUMENTS

| | | |
|---|---|---|
| KR | 10-1999-0055127 | 7/1999 |
| KR | 10-2001-0077719 | 8/2001 |
| KR | 10-2002-0096682 | 12/2002 |
| KR | 10-2006-0002228 | 1/2006 |
| KR | 10-2006-0070356 | 3/2006 |

* cited by examiner

*Primary Examiner*—Stephen Rosasco
(74) *Attorney, Agent, or Firm*—Marshall, Gerstein & Borun LLP

(57) ABSTRACT

A method for repairing a bridge in a photo mask includes disposing a phase shift layer pattern and a light shielding layer pattern over a transparent substrate with the phase shift layer pattern disposed between the transparent substrate and the light shielding layer; forming a resist layer over the entire surface of the photo mask having a defective pattern causing a bridge between neighboring portions of the phase shift layer pattern; exposing the defective pattern by etching the resist layer; and removing the exposed defective pattern.

4 Claims, 4 Drawing Sheets

METHOD FOR REPAIRING BRIDGE IN PHOTO MASK

CROSS-REFERENCE TO RELATED APPLICATION

The priority of Korean patent application number 10-2006-138838, filed on 29 Dec. 2006, the disclosure of which is incorporated by reference in its entirety, is claimed.

BACKGROUND OF THE INVENTION

The invention relates to a photo mask and, more particularly, to a method for repairing a bridge in a photo mask.

As semiconductor devices have become more highly integrated, the sizes of patterns formed on wafers have continuously decreased. To form such fine patterns, a photolithography process using a photo mask is typically used. Although there are various types of photo masks, a phase shift mask in particular functions to effectively lower the spatial frequency of a pattern by appropriately shifting the phase of light on the mask, or utilizes the effect of interference for increasing edge contrast. It is known that performing an exposure process using a phase shift mask is efficient to realize high resolution and to increase the depth of focus. During the fabrication of the phase shift mask, however, defective patterns may be generated, causing a bridge between neighboring phase shift layer patterns. The existence of the defective pattern may make it impossible to transcribe a desired pattern on a wafer, thereby causing device defects. Accordingly, it is necessary to remove the defective pattern causing a bridge, prior to processing a photolithography process.

FIGS. 1 to 3 are sectional views illustrating a conventional method for repairing a bridge in a photo mask. Referring to FIG. 1, a phase shift layer pattern 110 and a light shielding layer pattern 120 are disposed, from bottom to top, on a transparent quartz substrate 100. The phase shift layer pattern 110 is typically formed of a molybdenum silicon nitride (MoSiN) layer, and the light shielding layer pattern 120 is typically formed of a chromium (Cr) layer. As mentioned above, during the fabrication of the photo mask, a defective pattern 112 may be generated, causing a bridge between neighboring portions of the phase shift layer pattern 110.

Referring to FIG. 2, to remove the defective pattern 112, a laser beam 222 is irradiated onto the defective pattern 112. When occasion demands, an ion beam may be used, instead of the laser beam. In either case, a shielding layer 210 having an opening 211 is used to protect a normal pattern. The beam 222 is irradiated onto the defective pattern 112 through the opening 211 of the shielding layer 210, so as to remove the defective pattern 112. However, if the shielding layer 210 is incorrectly aligned, it may cause a beam 224, having passed through the shielding layer 210, to be irradiated onto the light shielding layer pattern 120 adjacent to the defective pattern 112. In this case, as shown in FIG. 3, damage may occur to a resulting pattern that should be essentially normal, as designated by reference numeral "310", and damage may also occur to the transparent substrate 100 as designated by reference numeral "320."

BRIEF SUMMARY OF THE INVENTION

The invention provides a method for repairing a bridge in a photo mask having a defective pattern which causes the bridge between neighboring portions of a phase shift layer pattern, the method including the steps of: disposing a phase shift layer pattern and a light shielding layer pattern over a transparent substrate with the phase shift layer pattern being disposed between the light shielding layer and the transparent substrate; forming a resist layer over and entire surface of the photo mask with the defective pattern and bridge between neighboring portions of the phase shift layer pattern; exposing the defective pattern by etching the resist layer; and removing the exposed defective pattern.

The phase shift layer pattern is preferably formed of a molybdenum silicon nitride (MoSiN) layer, and the light shielding layer pattern is preferably formed of a chromium (Cr) layer.

The steps of exposing the defective pattern and removing the exposed defective pattern are preferably performed using a dry etching process.

The dry etching process is preferably performed by using an etching gas having an etching selectively between the resist layer and the light shielding layer pattern sufficiently high to prevent the light shielding layer pattern from being etched until the exposed defective pattern is removed.

DETAILED DESCRIPTION OF THE INVENTION

An exemplary embodiment of the invention is described in detail below with reference to the accompanying drawings. However, the invention may be embodied into a variety of different forms, and the following description is not intended to be limiting.

Figure 1:
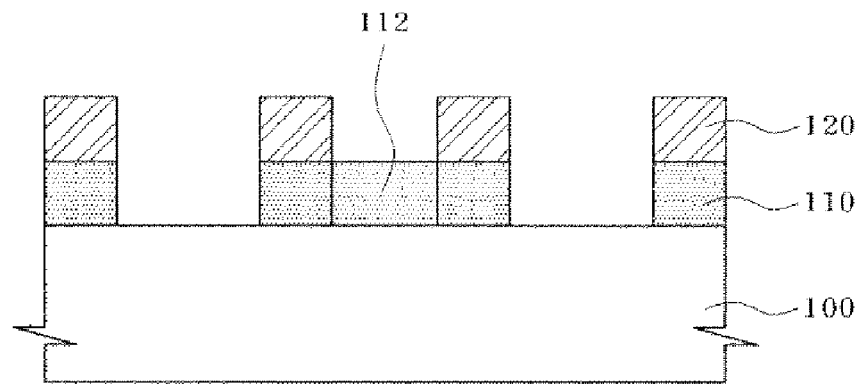
FIGS. 1 to 3 are sectional views illustrating a prior art method for repairing a bridge in a conventional photo mask.
Figure 2:
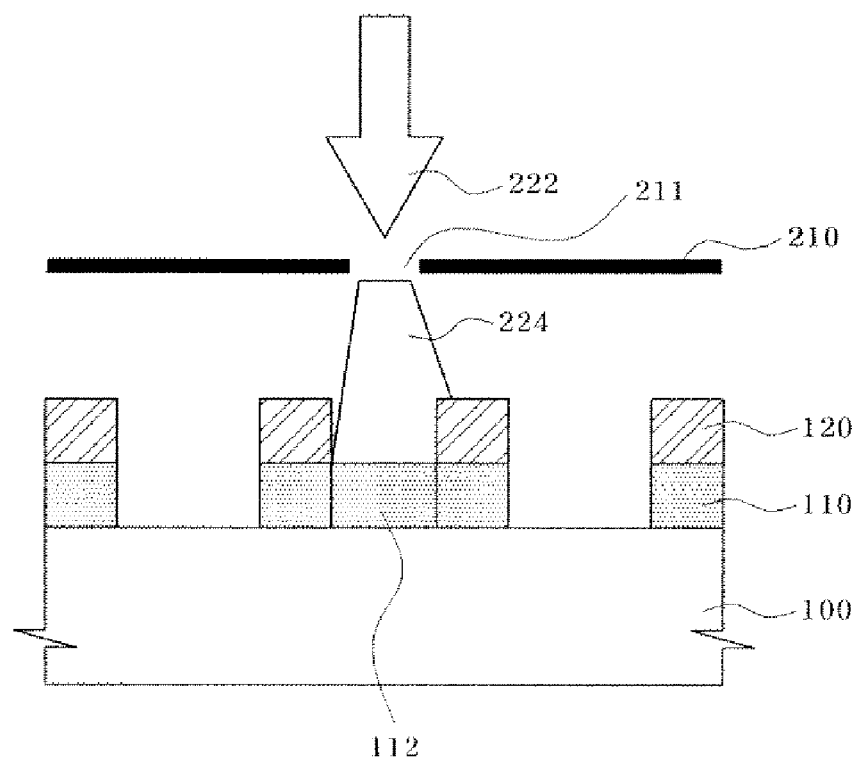
Figure 3:
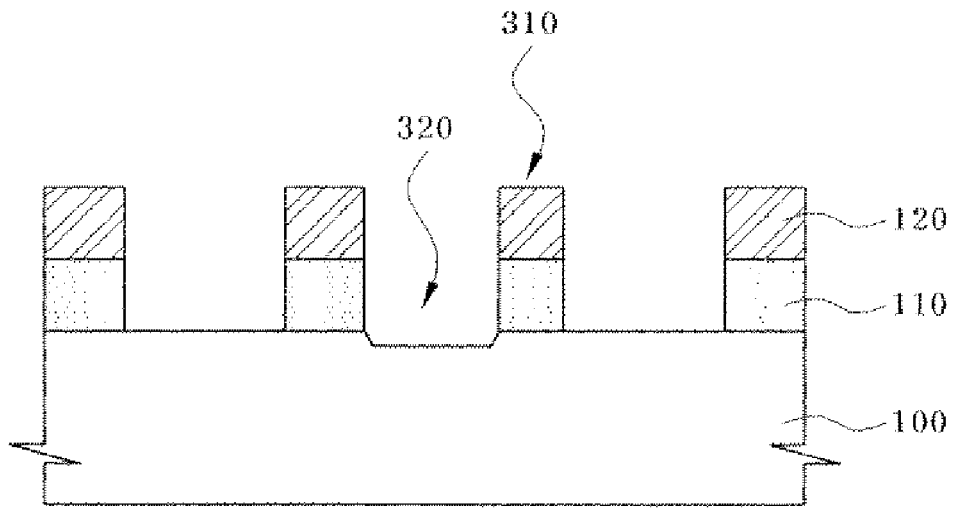
Figure 4:
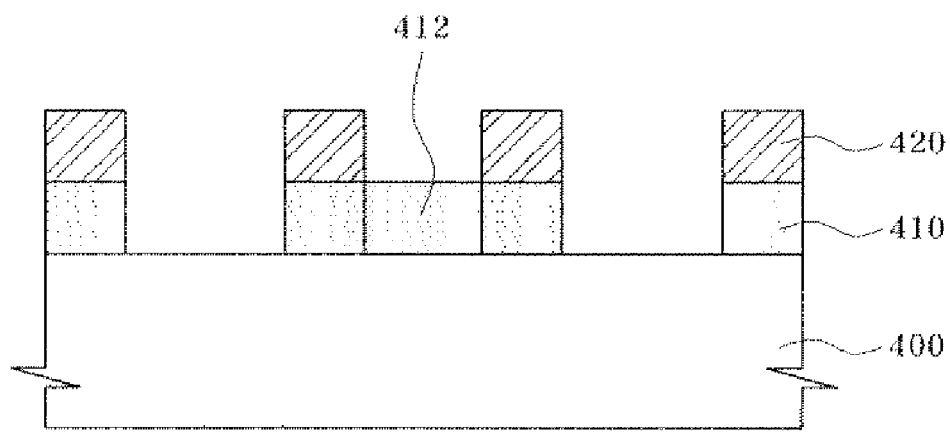
FIGS. 4 to 8 are sectional views illustrating a method for repairing a bridge in a photo-mask according to an embodiment of the invention.

FIGS. 4 to 8 are sectional views illustrating a method for repairing a bridge in a photo-mask according to an embodiment of the invention. Referring to FIG. 4, a phase shift layer pattern 410 and a light shielding layer pattern 420 are sequentially disposed, from bottom to top, on a transparent quartz substrate 400, with the phase shift layer pattern 410 disposed between the transparent substrate 400 and the light shielding layer pattern 420. The phase shift layer pattern 410 is preferably formed of a molybdenum silicon nitride (MoSiN) layer, and the light shielding layer pattern 420 is preferably formed of a chromium (Cr) layer. Although the configuration of a phase shift mask is exemplified in the illustrated embodiment, the invention may be applied equally well to other types of photo masks. To fabricate the photo mask, a phase shift layer and a light shielding layer are first sequentially formed, from bottom to top, on the transparent quartz substrate 400 and then, a resist layer pattern is formed over the light shielding layer. The light shielding layer pattern 420 and the phase shift layer pattern 410 are sequentially formed by an etching process using the resist layer pattern as an etching mask. In the etching process for forming the light shielding layer pattern 420, particles may be generated and remain on the phase shift layer to be etched. The particles remaining on the phase shift layer may prevent the etching of the phase shift layer, therefore a defective pattern 412 causing a bridge occurs. The defective pattern 412 may occur even in other processes included in the fabrication of the photo mask.

Figure 5:
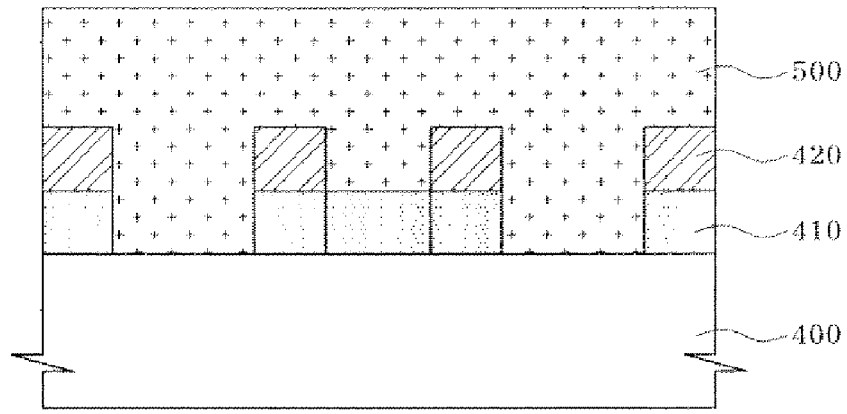

Referring to FIG. 5, to remove the defective pattern 412, a resist layer 500 is first formed over the entire surface of the photo mask such that all the transparent substrate 400, the phase shift layer pattern 410, the defective pattern 412, and the light shielding layer pattern 420 are covered by the resist layer 500. The resist layer 500 maybe any suitable photoresist layer.

Figure 6:
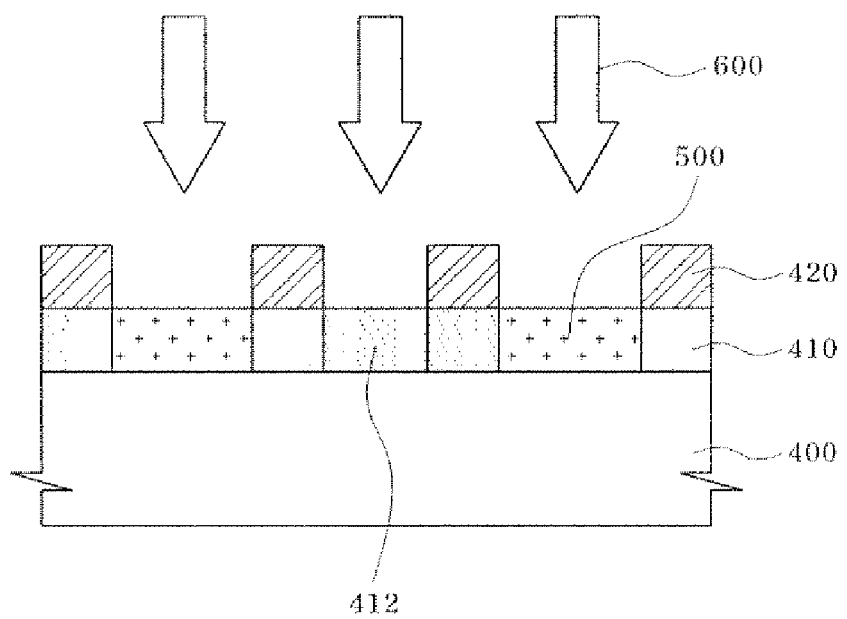

Referring to FIG. 6, as shown by arrows 600, a dry etching process is performed over the entire surface of the photo mask, illustratively using plasma dry etching. The dry etching process uses an etching gas having a sufficiently high etching selectivity between the resist layer 500 and the light shielding layer pattern 420 that substantially no light shielding layer pattern 420 is etched while the resist layer 500 is etched. The nature of the etching gas is selected based on the materials forming the light shielding layer pattern 420 and the resist layer 500, respectively. With the implementation of the etching process, a surface of the defective pattern 412 is exposed to the outside and, simultaneously, the resist layer 500 remains on the remaining region except for the defective pattern 412 by a thickness equal to the thickness of the defective pattern 412.

Figure 7:
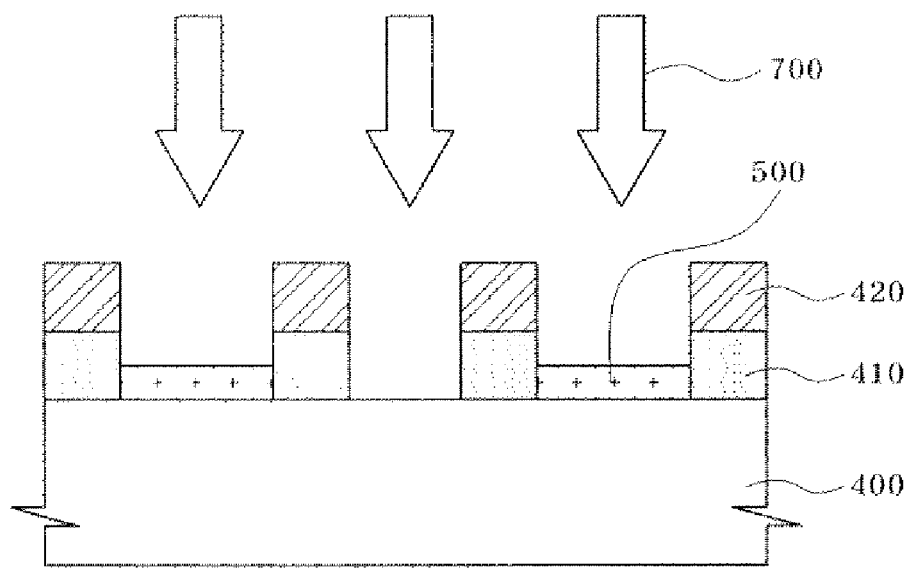

Referring to FIG. 7, as shown in the drawing by arrows 700, the dry etching process is continued. The continued etching is for the defective pattern (412 of FIG. 6) and the resist layer 500. With continued etching, the exposed defective pattern (412 of FIG. 6) is removed, and the resist layer 500 is almost removed or remains only by a small thickness (e.g. _____ Å)

Figure 8:
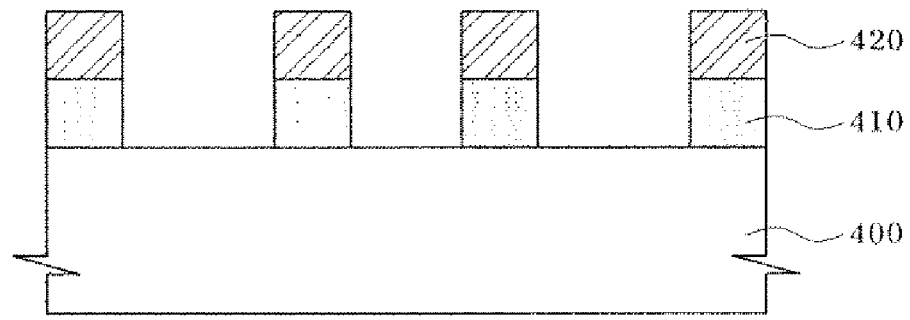

Referring to FIG. 8, the etching is continued further such that the residual resist layer (500 of FIG. 7) is removed to expose the surface of the transparent substrate 400. In this way, it is possible to fabricate the photo mask, from which the overall defective pattern causing a bridge is removed without damage to a normal pattern and the transparent substrate. Although a plasma dry etching process is used in the illustrated embodiment, a laser beam or ion beam may be used as occasion demands.

As apparent from the above description, with the inventive method for repairing a bridge in a photo mask, a resist layer serves as a protective layer for a normal pattern. This facilitates the removal of any defective pattern causing a bridge without damage to the normal pattern and an underlying transparent substrate.

What is claimed is:

1. A method for repairing a bridge in a photo mask having a defective pattern causing a bridge between neighboring portions of a phase shift layer pattern, the method including the steps of:

disposing a phase shift layer pattern and a light shielding layer pattern over a transparent substrate with the phase shift layer pattern being disposed between the light shielding layer and the transparent substrate;

forming a resist layer over an entire surface of the photo mask;

performing an etching process over the entire surface of the photo mask to etch the resist layer using an etching gas having a sufficiently high etching selectivity between the resist layer and the light shielding layer pattern so that substantially no light shielding layer pattern is etched while the resist layer is etched and the etched resist layer is disposed on the transparent substrate and a defective pattern is exposed by the etched resist layer; and performing a continued etching process over the exposed defective pattern and the resist layer to remove the exposed defective pattern.

2. The method according to claim 1, comprising forming the phase shift layer pattern of a molybdenum silicon nitride (MoSiN) layer, and forming the light shielding layer pattern of a chromium (Cr) layer.

3. The method according to claim 1, comprising performing the etching process and the continued etching process by a dry etching process.

4. The method according to claim 3, comprising performing the dry etching process by using an etching gas having an etching selectively between the resist layer and the light shielding layer pattern sufficiently high to prevent the light shielding layer pattern from being etched until the exposed defective pattern is removed.

\* \* \* \* \*